(12) United States Patent
Ogawa et al.

(10) Patent No.: US 11,097,366 B2
(45) Date of Patent: Aug. 24, 2021

(54) METHOD FOR MANUFACTURING ELECTRICAL COMPONENT AND ELECTRICAL COMPONENT

(71) Applicant: TOYOTA JIDOSHA KABUSHIKI KAISHA, Toyota (JP)

(72) Inventors: Takaoki Ogawa, Toyota (JP); Kouzou Matsuura, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 362 days.

(21) Appl. No.: 16/220,326

(22) Filed: Dec. 14, 2018

(65) Prior Publication Data

US 2019/0217408 A1    Jul. 18, 2019

(30) Foreign Application Priority Data

Jan. 12, 2018  (JP) ............................. JP2018-003462

(51) Int. Cl.
*H05K 5/00* (2006.01)
*B23K 1/00* (2006.01)
*H01M 8/0271* (2016.01)

(52) U.S. Cl.
CPC .......... *B23K 1/0008* (2013.01); *H01M 8/0271* (2013.01)

(58) Field of Classification Search
CPC .......... H02G 3/08; H02G 3/081; H02G 3/088; H05K 5/00; H05K 5/02; H05K 5/0204; H01M 8/0271; H01M 8/0273; H01M 8/0276; H01M 8/80278; H01M 8/028; B23K 1/0008; B23K 1/00

USPC ....... 174/50, 520, 50.5, 50.51, 50.52, 50.61, 174/521, 533, 535, 539, 554, 559, 560, 174/564; 439/76.1, 76, 949, 587, 588, 439/936, 933

See application file for complete search history.

(56) References Cited

U.S. PATENT DOCUMENTS 5,978,226 A *  11/1999  Thomas ............. H05K 7/20854
                                                    361/707
6,249,438 B1 *  6/2001  Thomas ............... B60R 16/0239
                                                    361/707
(Continued)

FOREIGN PATENT DOCUMENTS

JP    H03-186669 A    8/1991
JP    2007317968 A   12/2007
(Continued)

*Primary Examiner* — Angel R Estrada
(74) *Attorney, Agent, or Firm* — Dickinson Wright, PLLC

(57) ABSTRACT

An electrical component configured to reduce a decrease in lifetime of a solder bonding portion of a lead terminal, and a method for manufacturing the electrical component are provided. The electrical component includes a unit, a housing case, and a sealing member. The unit includes a circuit board, a cover member covering the circuit board, and a lead terminal integrated with the cover member and soldered to the circuit board. The housing case houses the unit. The sealing member is disposed between the cover member and the housing case. The method for manufacturing the electrical component includes positioning the unit with respect to the housing case while disposing a liquid sealing member as a precursor of the sealing member between the cover member and the housing case, and hardening the liquid sealing member after the positioning.

6 Claims, 3 Drawing Sheets

(56) References Cited

U.S. PATENT DOCUMENTS

| | | | | |
|---|---|---|---|---|
| 7,144,275 | B2* | 12/2006 | Iida | H05K 5/062 |
| | | | | 439/587 |
| 7,390,199 | B2* | 6/2008 | Honda | H01R 12/57 |
| | | | | 439/78 |
| 7,561,435 | B2* | 7/2009 | Kamoshida | H05K 5/0052 |
| | | | | 174/50.5 |
| 8,107,251 | B2* | 1/2012 | Yamauchi | H05K 5/0069 |
| | | | | 361/752 |
| 8,657,609 | B2* | 2/2014 | Yanagisawa | H05K 5/0082 |
| | | | | 439/79 |
| 2017/0101031 | A1 | 4/2017 | Ohashi | |
| 2018/0192526 | A1 | 7/2018 | Suzuki et al. | |

FOREIGN PATENT DOCUMENTS

| | | |
|---|---|---|
| JP | 2017017119 A | 1/2017 |
| JP | 2017-074819 A | 4/2017 |

* cited by examiner

METHOD FOR MANUFACTURING ELECTRICAL COMPONENT AND ELECTRICAL COMPONENT

CROSS REFERENCE TO RELATED APPLICATIONS

The present application claims priority from Japanese patent application JP 2018-003462 filed on Jan. 12, 2018, the content of which is hereby incorporated by reference into this application.

BACKGROUND

Technical Field

The present disclosure relates to a method for manufacturing an electrical component and the electrical component.

Background Art

Conventionally, as a technique in such a field, there has been known an electrical component used for a fuel cell system as disclosed in, for example, JP 2017-74819 A. As illustrated in FIG. 4, this type of electrical component is typically configured to include a unit 13, a housing case 5, and a sealing member 12. The unit 13 includes a circuit board 2, a cover member 3 covering the circuit board 2, and a lead terminal 4 integrated with the cover member 3 and soldered to the circuit board 2. The housing case 5 houses this unit 13. The sealing member 12 ensures air tightness and liquid tightness between the cover member 3 of the unit 13 and the housing case 5. Then, a solid gasket is employed as the sealing member 12, and this gasket is sandwiched between the cover member 3 and a case cover 53 of the housing case 5.

However, when the solid gasket is employed as the sealing member 12, a repulsion force of this gasket reaches a solder bonding portion 8 of the lead terminal 4 via the cover member 3 and the lead terminal 4, resulting in a state where a stress is constantly applied to the solder bonding portion 8. In view of this, a problem arises in that a lifetime of the solder bonding portion 8 decreases.

The present disclosure has been made to solve such a technical problem, and provides an electrical component configured to reduce a decrease in lifetime of a solder bonding portion of a lead terminal, and a method for manufacturing the electrical component.

SUMMARY

A method for manufacturing the electrical component according to the present disclosure is a method for manufacturing an electrical component that includes a unit, a housing case, and a sealing member. The unit includes a circuit board, a cover member covering the circuit board, and a lead terminal soldered to the circuit board and integrated with the cover member. The housing case houses the unit. The sealing member is disposed between the cover member of the unit and the housing case. The method includes: positioning the circuit board, the lead terminal, and the cover member in the unit, or/and positioning the unit with respect to the housing case, while disposing a liquid sealing member as a precursor of the sealing member between the cover member and the housing case; and hardening the liquid sealing member after the positioning.

In the method for manufacturing the electrical component according to the present disclosure, the sealing member is formed by hardening the liquid sealing member after positioning the circuit board, the lead terminal, and the cover member in the unit, or/and positioning the unit with respect to the housing case. Accordingly, a stress applied to the solder bonding portion of the lead terminal can be reduced, so as to ensure reducing a decrease in lifetime of the solder bonding portion of the lead terminal. In addition, use of a fluidity and a following capability of the liquid sealing member ensures the facilitated above-described positioning.

In the method for manufacturing the electrical component according to the present disclosure, a seal housing portion that houses the sealing member may be disposed on a top surface of the cover member, and the housing case may include a projecting portion internally inserted into the seal housing portion such that a distal end of the projecting portion has a clearance with a bottom surface of the seal housing portion. In the positioning, the liquid sealing member may be disposed between the cover member and the housing case by filling the liquid sealing member in the seal housing portion so as to fill at least the clearance between the distal end of the projecting portion and the bottom surface of the seal housing portion. In this case, the clearance between the distal end of the projecting portion and the bottom surface of the seal housing portion does not cause the stress, which conventionally occurred, on the solder bonding portion via the cover member and the lead terminal. Accordingly, the decrease in lifespan of the solder bonding portion of the lead terminal can be reduced. Filling and accumulating the liquid sealing member in the seal housing portion can reduce the occurrence of dripping and flowing of the liquid sealing member, so as to ensure the reduction of the usage of the sealing member.

An electrical component according to the present disclosure includes a unit, a housing case, and a sealing member. The unit includes a circuit board, a cover member, and a lead terminal. The cover member covers the circuit board. The lead terminal is soldered to the circuit board and integrated with the cover member. The housing case houses the unit. The sealing member is disposed between the cover member of the unit and the housing case. A seal housing portion that houses the sealing member is disposed on a top surface of the cover member. The housing case includes a projecting portion internally inserted into the seal housing portion such that a distal end of the projecting portion has a clearance with a bottom surface of the seal housing portion. The clearance between the distal end of the projecting portion and the bottom surface of the seal housing portion is sealed with the sealing member housed in the seal housing portion.

In the electrical component according to the present disclosure, the seal housing portion that houses the sealing member is disposed on the top surface of the cover member, the projecting portion is disposed at the housing case such that the distal end is inserted into the seal housing portion so as to have the clearance with the bottom surface of the seal housing portion, and the clearance between the distal end of the projecting portion and the bottom surface of the seal housing portion is sealed with the sealing member housed in the seal housing portion. Accordingly, the stress on the solder bonding portion of the lead terminal conventionally caused by the repulsion force of the sealing member can be decreased, so as to ensure reducing the decrease in lifetime of the solder bonding portion of the lead terminal.

In the electrical component according to the present disclosure, the sealing member may be a liquid gasket. This configuration ensures reducing the decrease in lifetime of the solder bonding portion of the lead terminal using the fluidity and the following capability of the liquid gasket before hardening and an excellent seal performance provided through hardening, and the air tightness and the liquid tightness between the cover member and the housing case are ensured.

In the electrical component according to the present disclosure, the seal housing portion may be a recessed groove disposed on the top surface of the cover member. This configuration ensures the short projecting portion internally inserted into the seal housing portion, so as to achieve the thinned housing case.

In the electrical component according to the present disclosure, the distal end of the projecting portion may be internally inserted into the sealing member housed in the seal housing portion. This configuration ensures the air tightness and the liquid tightness between the cover member and the housing case with more certainty.

With the present disclosure, the decrease in lifetime of the solder bonding portion of the lead terminal can be reduced.

DETAILED DESCRIPTION

Figure 1:
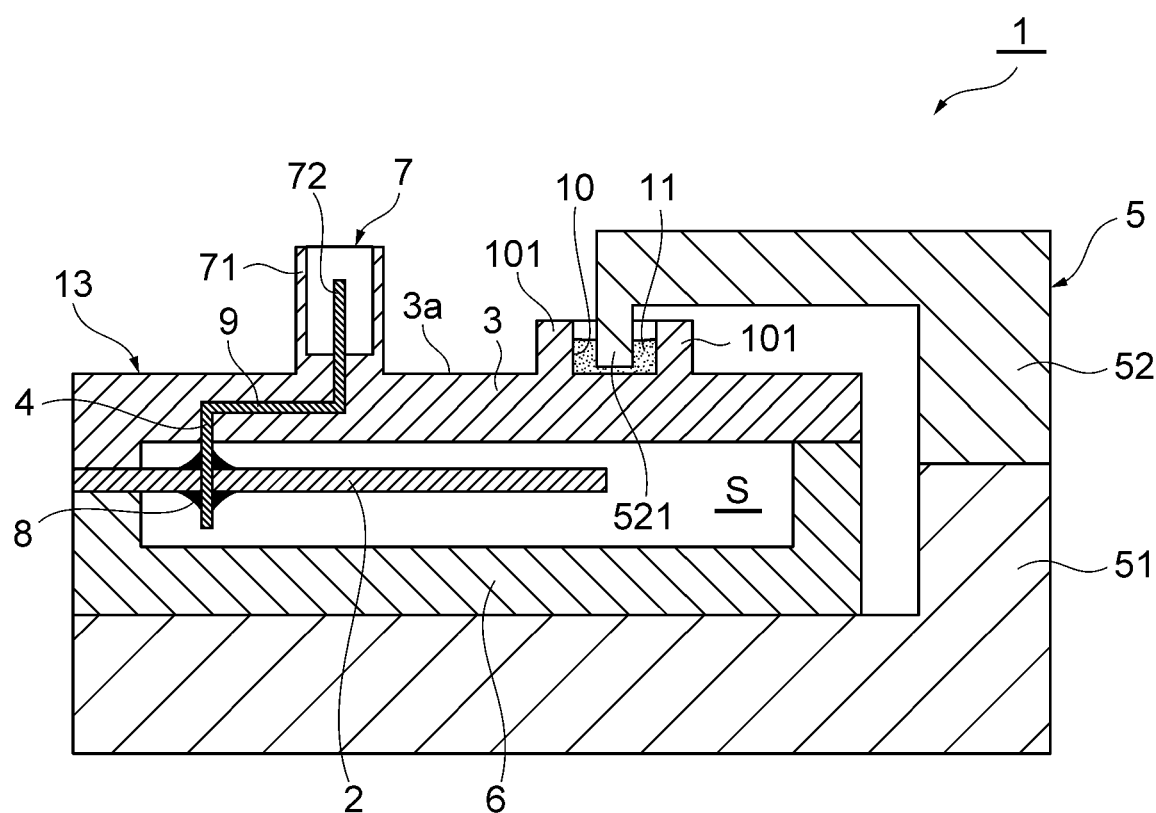
FIG. 1 is a schematic cross-sectional view illustrating a configuration of an electrical component according to a first embodiment.

The following describes embodiments of the present disclosure with reference to the drawings. In descriptions of the drawings, identical reference numerals are given to identical elements, and therefore repeated explanations will be omitted.

First Embodiment

Figure 2:
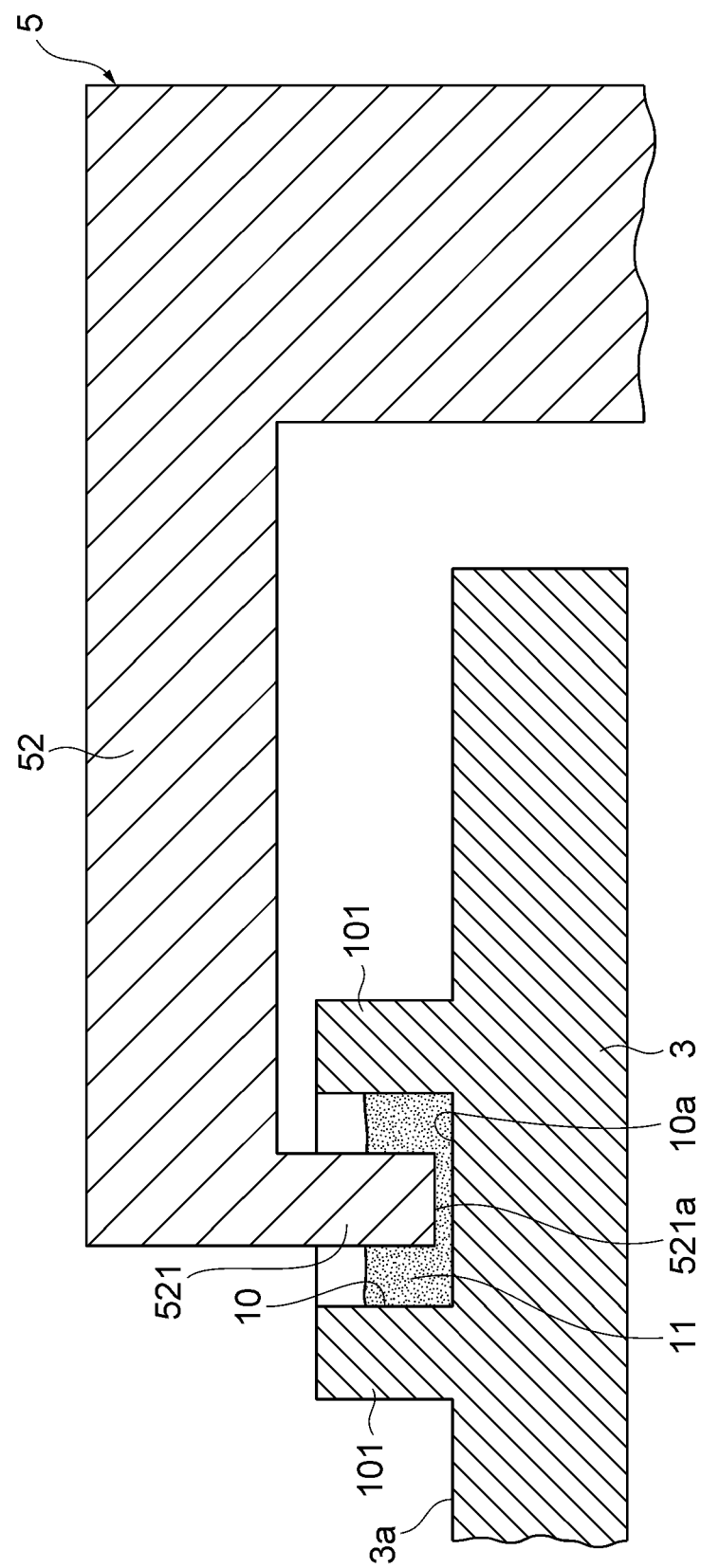
FIG. 2 is an enlarged cross-sectional view illustrating a positional relationship between a projecting portion and a seal housing portion.

FIG. 1 is a schematic cross-sectional view illustrating a configuration of an electrical component according to the first embodiment, and FIG. 2 is an enlarged cross-sectional view illustrating a positional relationship between a projecting portion and a seal housing portion. An electrical component 1 of this embodiment is used for, for example, a fuel cell system, and includes a unit 13, a housing case 5 that houses this unit 13, and a sealing member 11 disposed between a cover member 3 (described later) of the unit 13 and the housing case 5.

The unit 13 includes a circuit board 2, a base 6 supporting the circuit board 2, the cover member 3 covering the circuit board 2, and a lead terminal 4 integrated with the cover member 3 and soldered to the circuit board 2. The circuit board 2 is a printed board on which, for example, a plurality of electric circuits are disposed, and is secured to the base 6 by screwing or similar way.

The base 6 is made of, for example, a metal such as aluminum and disposed below the circuit board 2. The cover member 3 is made of, for example, a resin material and disposed above the circuit board 2. This cover member 3 is disposed to be opposed to this base 6 so as to form a space S with the base 6, and the cover member 3 is secured to the base 6 by screwing or similar way.

The lead terminal 4 is made of a metallic material, and integrally formed with the cover member 3 by insert molding or similar way. This lead terminal 4 has a portion internally inserted into the cover member 3 and a portion exposed outside the cover member 3. The lead terminal 4 is electrically connected to the circuit board 2 by soldering in a state where the exposed portion is inserted through a through-via of the circuit board 2. Thus, the lead terminal 4 includes a solder bonding portion 8.

The electrical component 1 of this embodiment further includes a connector 7 disposed on a top surface 3a of the cover member 3. The connector 7 includes a resin housing 71 disposed upright on the top surface 3a of the cover member 3 and a metallic contact terminal 72 disposed inside the housing 71. The housing 71 has an approximately rectangular tubular shape, and is integrally formed with the cover member 3.

Meanwhile, the contact terminal 72 has a portion internally inserted into the cover member 3 and a portion exposed outside the cover member 3. Then, the portion of the contact terminal 72 internally inserted into the cover member 3 is electrically connected to a metallic busbar 9 disposed inside the cover member 3. Therefore, the contact terminal 72 is electrically connected to the above-described lead terminal 4 via the busbar 9.

The housing case 5 has a space for internally housing the unit 13, and includes a case body 51 and a case cover 52, which is configured to be removable from the case body 51 and disposed on the upper side of the case body 51. The case body 51 and the case cover 52 are each made of, for example, a metallic material such as aluminum, and coupled to one another by bolt fastening. The unit 13 is secured to the case body 51 by screwing or similar way.

On the top surface 3a of the cover member 3, a seal housing portion 10 housing the above-described sealing member 11 is disposed. The seal housing portion 10 is surrounded by a frame-shaped standing wall 101 disposed upright on the top surface 3a. The standing wall 101 is made of, for example, a resin material, and integrated with the cover member 3. While the illustration is omitted, the seal housing portion 10 is formed in a ring shape in plan view so as to surround the connector 7.

The sealing member 11 is a liquid gasket. The liquid gasket includes, for example, a Formed In Place Gasket (FIPG). The liquid gasket here may be a liquid gasket of a one-component type or a two-component mixing type, and may be a liquid gasket of a room-temperature hardening type or a heat hardening type.

Meanwhile, the case cover 52 includes a projecting portion 521 internally insertable into the seal housing portion 10. As illustrated in FIG. 2, the projecting portion 521 projects from the case cover 52 toward the seal housing portion 10, and the projecting portion 521 has a distal end 521a internally inserted into the seal housing portion 10 so as to have a clearance with a bottom surface 10a of the seal housing portion 10. The distal end 521a of the projecting portion 521 has a planar shape and is internally inserted into the sealing member 11 housed in the seal housing portion 10. Accordingly, not only the clearance in the up-down direction between the distal end 521a of the projecting portion 521 and the bottom surface 10a of the seal housing portion 10, but also a peripheral area of the distal end portion including the distal end 521a is sealed with the sealing member 11.

In the electrical component 1 configured as described above, the seal housing portion 10 housing the sealing member 11 is disposed on the top surface 3a of the cover member 3, and the projecting portion 521 inserted into this seal housing portion 10 is disposed on the case cover 52 such that the distal end 521a has the clearance with the bottom surface 10a of the seal housing portion 10, thus the clearance between the distal end 521a of the projecting portion 521 and the bottom surface 10a of the seal housing portion 10 is sealed with the sealing member 11. In view of this, a stress on the solder bonding portion 8 of the lead terminal 4 conventionally caused by a repulsion force of the sealing member can be decreased, thus ensuring the reduction of a decrease in lifetime of the solder bonding portion 8.

Since the sealing member 11 is the liquid gasket, a fluidity and a following capability of the liquid gasket before hardening and an excellent seal performance provided through hardening can be used to reduce the decrease in lifetime of the solder bonding portion 8 of the lead terminal 4, and an air tightness and a liquid tightness between the cover member 3 and the case cover 52 are ensured. Furthermore, since the distal end 521a of the projecting portion 521 is internally inserted into the sealing member 11 housed in the seal housing portion 10, the air tightness and the liquid tightness between the cover member 3 and the case cover 52 are ensured with more certainty.

The following describes a method for manufacturing the electrical component 1. The method for manufacturing the electrical component 1 according to this embodiment mainly includes a positioning step of positioning the unit 13 with respect to the housing case 5 while disposing a liquid sealing member as a precursor of the sealing member 11 between the cover member 3 and the housing case 5, and a hardening step of hardening the liquid sealing member after the positioning step.

In the positioning step, first, the unit 13 integrated with the connector 7 and the seal housing portion 10, and the housing case 5 including the case body 51 and the case cover 52 are each prepared. Subsequently, the unit 13 is secured to a predetermined position on the case body 51 of the housing case 5 by screwing or similar way.

Next, the liquid sealing member (for example, FIPG) is filled in the seal housing portion 10. A filling volume of the FIPG is set such that in a state where the case cover 52 is assembled with the case body 51 later, the distal end 521a of the projecting portion 521 is internally inserted into this FIPG, in other words, a liquid surface of the FIPG becomes higher than the distal end 521a of the projecting portion 521.

Next, the case cover 52 is assembled with the case body 51 such that the projecting portion 521 is internally inserted into the seal housing portion 10, and further, the case cover 52 and the case body 51 are connected and secured to one another by bolt fastening. Then, in the state where the case cover 52 is connected and secured to the case body 51 (that is, the state where the case cover 52 is assembled with the case body 51), a clearance is generated between the distal end 521a of the projecting portion 521 of the case cover 52 and the bottom surface 10a of the seal housing portion 10, and this clearance is filled with the FIPG.

Next, the unit 13 is positioned with respect to the housing case 5. Specifically, with a premise that the clearance is generated between the distal end 521a of the projecting portion 521 and the bottom surface 10a of the seal housing portion 10, the unit 13 is positioned such that the projecting portion 521 is arranged at the center position of the seal housing portion 10 while, for example, adjusting looseness of a fixation screw. At this time, the liquid FIPG allows an easy positioning of the unit 13.

In this positioning step, the FIPG may be filled in the seal housing portion 10 after the preceding connection and securing of the case cover 52 to the case body 51, in addition to the above-described method where the case cover 52 is connected and secured to the case body 51 after filling the FIPG.

In the hardening step after the positioning step, the FIPG is hardened. For example, the FIPG of the room-temperature hardening type is left in a room temperature so as to be naturally hardened. Meanwhile, the FIPG of the heat hardening type is heated so as to be hardened. Then, when the FIPG is hardened, the projecting portion 521 is bonded to the cover member 3 with the FIPG, and the clearance between the distal end 521a of the projecting portion 521 and the bottom surface 10a of the seal housing portion 10 is sealed with the FIPG.

In the method for manufacturing the electrical component 1 according to this embodiment, with the clearance between the distal end 521a of the projecting portion 521 of the case cover 52 and the bottom surface 10a of the seal housing portion 10, the stress, which occurs in conventional method, does not occur on the solder bonding portion via the cover member and the lead terminal. Consequently, the stress on the solder bonding portion 8 of the lead terminal 4 can be decreased, and the decrease in lifetime of the solder bonding portion 8 can be reduced. The sealing member 11 is formed by hardening the liquid sealing member after positioning the unit 13 with respect to the housing case 5, thus ensuring the easy positioning of the unit 13 using the fluidity and the following capability of the liquid sealing member before hardening. Furthermore, filling and accumulating the liquid sealing member in the seal housing portion 10 can reduce the occurrence of dripping and flowing of the liquid sealing member, thus ensuring the reduction of the usage of the sealing member 11.

Second Embodiment

Figure 3:
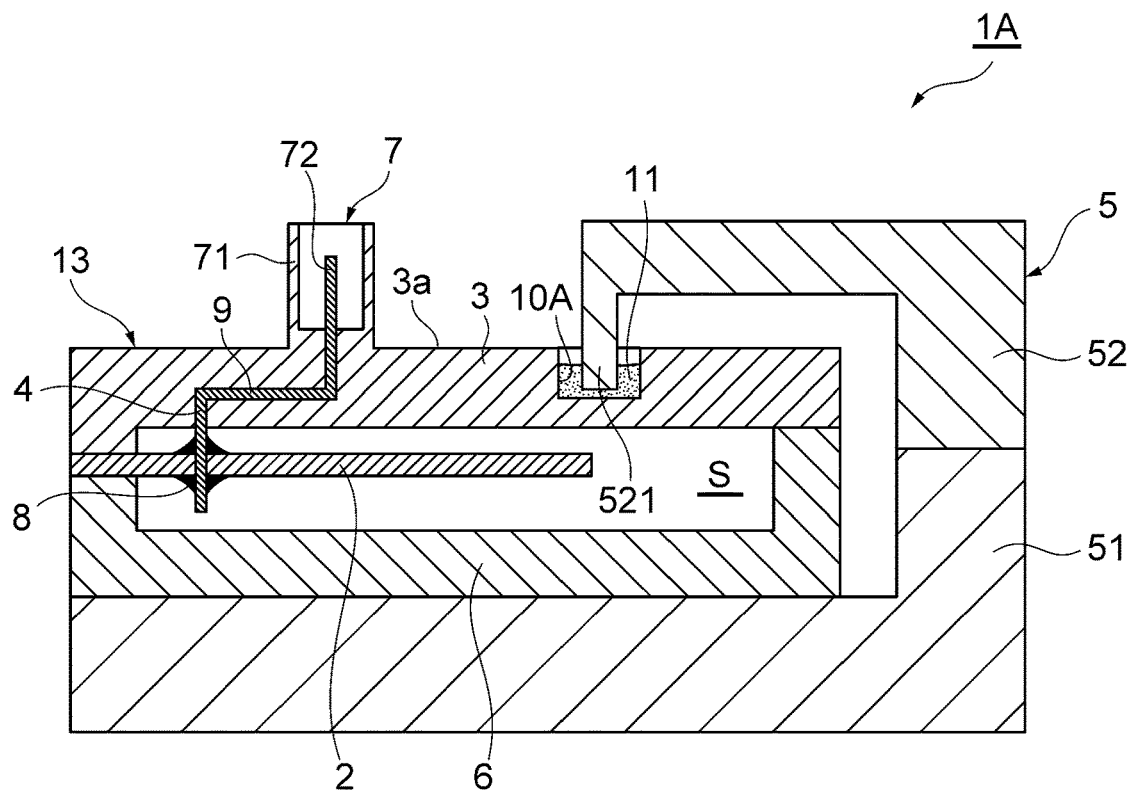
FIG. 3 is a schematic cross-sectional view illustrating a configuration of an electrical component according to a second embodiment.
Figure 4:
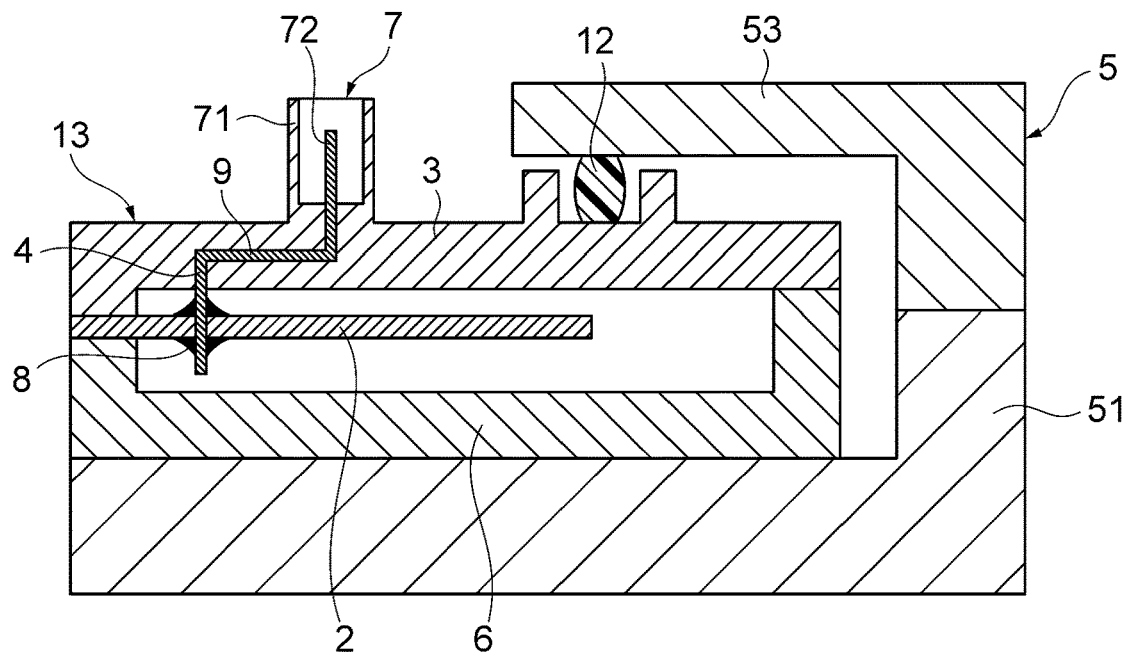
FIG. 4 is a schematic cross-sectional view illustrating a configuration of an electrical component according to a conventional technique.

FIG. 3 is a schematic cross-sectional view illustrating a configuration of an electrical component according to the second embodiment. While an electrical component 1A in this embodiment is different from the electrical component 1 in the above-described first embodiment in a shape of a seal housing portion 10A, other configurations are similar to those of the first embodiment, and therefore repeated explanations will be omitted.

As illustrated in FIG. 3, the seal housing portion 10A is a recessed groove formed by internally recessing the cover member 3 from the top surface 3a of the cover member 3. Thus configured electrical component 1A provides operational advantages similar to those of the above-described first embodiment. Additionally, the seal housing portion 10A formed by internally recessing the cover member 3 from the top surface 3a of the cover member 3 is less influenced by a height of the standing wall 101 compared with the seal housing portion 10 in the first embodiment. Accordingly, the projecting portion 521 is allowed to be shortened, thus ensuring the thinned housing case 5.

The method for manufacturing the electrical component 1A according to this embodiment is identical to the method for manufacturing the electrical component 1 according to the first embodiment, and therefore its explanation will be omitted here.

While the embodiments of the present disclosure have been described in detail above, the present disclosure is not limited thereto, and can be subjected to various kinds of changes of design without departing from the spirit of the present disclosure described in the claims. For example, while the positioning of the unit 13 with respect to the housing case 5 is exemplified and described as the positioning step in the above-described embodiment, the positioning of the circuit board 2, the cover member 3, and the lead terminal 4 in the unit 13 may be performed as necessary, or both the positioning of the unit 13 with respect to the housing case 5 and the positioning of the circuit board 2, the cover member 3, and the lead terminal 4 in the unit 13 may be performed.

DESCRIPTION OF SYMBOLS 1, 1A Electrical component
2 Circuit board
3 Cover member
3a Top surface
4 Lead terminal
5 Housing case
6 Base
7 Connector
8 Solder bonding portion
9 Busbar
10, 10A Seal housing portion
10a Bottom surface
11 Sealing member
13 Unit
51 Case body
52 Case cover
71 Housing
72 Contact terminal
101 Standing wall
521 Projecting portion
521a Distal end

What is claimed is:

1. An electrical component comprising:
 a unit that includes a circuit board, a cover member, and a lead terminal, the cover member covering the circuit board, the lead terminal being soldered to the circuit board and integrated with the cover member, the lead terminal connected to the circuit board from an underside of the cover member;
 a housing case that houses the unit; and
 a sealing member disposed between the cover member of the unit and the housing case,
 wherein a seal housing portion that houses the sealing member is disposed on a top surface of the cover member,
 wherein the housing case includes a projecting portion internally inserted into the seal housing portion such that a distal end of the projecting portion has a clearance with a bottom surface of the seal housing portion, and
 wherein the clearance between the distal end of the projecting portion and the bottom surface of the seal housing portion is sealed with the sealing member housed in the seal housing portion.

2. The electrical component according to claim 1, wherein the sealing member is a liquid gasket.

3. The electrical component according to claim 1, wherein the seal housing portion is a recessed groove disposed on the top surface of the cover member.

4. The electrical component according to claim 1, wherein the distal end of the projecting portion is internally inserted into the sealing member housed in the seal housing portion.

5. A method for manufacturing an electrical component, wherein the electrical component includes:
 a unit that includes a circuit board, a cover member covering the circuit board, and a lead terminal soldered to the circuit board and integrated with the cover member, the lead terminal connected to the circuit board from an underside of the cover member;
 a housing case that houses the unit; and
 a sealing member disposed between the cover member of the unit and the housing case,
 wherein the method comprising:
 positioning the circuit board, the lead terminal, and the cover member in the unit, or/and positioning the unit with respect to the housing case, while disposing a liquid sealing member as a precursor of the sealing member between the cover member and the housing case; and
 hardening the liquid sealing member after the positioning.

6. The method for manufacturing the electrical component according to claim 5,
 wherein a seal housing portion that houses the sealing member is disposed on a top surface of the cover member,
 wherein the housing case includes a projecting portion internally inserted into the seal housing portion such that a distal end of the projecting portion has a clearance with a bottom surface of the seal housing portion, and
 wherein in the positioning, the liquid sealing member is disposed between the cover member and the housing case by filling the liquid sealing member in the seal housing portion so as to fill at least the clearance between the distal end of the projecting portion and the bottom surface of the seal housing portion.

* * * * *